(12) United States Patent
Hinson

(10) Patent No.: US 8,438,201 B2
(45) Date of Patent: May 7, 2013

(54) DIGITAL FRACTIONAL INTEGRATOR

(75) Inventor: Jerry R. Hinson, Mountain View, CA (US)

(73) Assignee: Raytheon Applied Signal Technology, Inc., Sunnyvale, CA (US)

( * ) Notice: Subject to any disclaimer, the term of this patent is extended or adjusted under 35 U.S.C. 154(b) by 574 days.

(21) Appl. No.: 12/772,074

(22) Filed: Apr. 30, 2010

(65) Prior Publication Data
US 2011/0270903 A1    Nov. 3, 2011

(51) Int. Cl.
*G06F 7/38* (2006.01)
*G06F 7/00* (2006.01)

(52) U.S. Cl.
USPC ............ 708/235; 708/201; 708/203; 708/205

(58) Field of Classification Search ......................... None
See application file for complete search history.

(56) References Cited

U.S. PATENT DOCUMENTS

| | | |
|---|---|---|
| 2002/0158814 A1 | 10/2002 | Bright et al. |
| 2002/0168951 A1 | 11/2002 | Paulus et al. |
| 2008/0034161 A1* | 2/2008 | Savell ........................... 711/118 |
| 2009/0213947 A1 | 8/2009 | Rao et al. |
| 2010/0226264 A1* | 9/2010 | Axmon et al. ................ 370/252 |

OTHER PUBLICATIONS

Tomarakos, John et al., "Using the Low-Cost, High Performance ADSP-21065L Digital Signal Processor for Digital Audio Applications", pp. 1-108, Revision 1.0, Dec. 4, 1998.
International Search Report and Written Opinion for International application No. PCT/US11/34366, mailed Jul. 27, 2011.

* cited by examiner

*Primary Examiner* — Scott Sun
(74) *Attorney, Agent, or Firm* — Christie, Parker & Hale, LLP

(57) ABSTRACT

A method and apparatus for fractional digital integration of an input signal is provided, the input signal including a time series of numerical values and the method or apparatus including applying the input signal time series to one input of a two-input summer at a time I, providing an output of the summer to a delay register at time I, providing an output of the delay register from time i−1 to a two-input multiplier, providing an output of the multiplier to the summer at time I, using a resettable counter to determine a value i and index a lookup table with i to provide the indexed value of the lookup table as an input to the multiplier, and obtaining an output signal time series from the output of the summer.

12 Claims, 1 Drawing Sheet

DIGITAL FRACTIONAL INTEGRATOR

TECHNICAL FIELD

The present invention pertains generally to the field of digital signal processing (DSP), and more particularly to integration of digital signals using a fractional order of integration.

BACKGROUND

Digital integration is a common DSP operation used in, for example, infinite-impulse response (IIR) filters, cascaded integrator-comb (CIC) filters and statistical signal parameter estimation. In such applications, the order of the integration integral is generally unity.

FIG. 1 is a schematic block diagram illustrating a prior art implementation of a digital integrator 10 with unity order of integration. In FIG. 1, a summer 12 sums the input signal $x_i$ on line 14 with feedback signal $y_{i-1}$ on line 16 to produce the output signal $y_i$ on line 18. A delay register $z^{-1}$ 20 delays signal $y_i$ on line 18 by one sample delay producing the signal $y_{i-1}$ on line 22. The following equation (EQ. 1) gives a mathematical description for the computation performed by the digital integrator circuit illustrated in FIG. 1:

$$y_i = \sum_{i=0}^{n} (x_i + y_{i-1})$$

Alternatively, the following equation (EQ. 2) is the z-transform description of the digital integrator circuit illustrated in FIG. 1:

$$y(z) = \frac{1}{1 - z^{-1}} x(z)$$

This prior art approach is restricted to performing digital integration where the order of the integration integral is unity.

Digital integration using non-integer or fractional-order integrals is a mathematical operation defined by the mathematical field of fractional calculus that computes integrals having non-integer order. Fractional calculus for the continuous domain was first described by Bernhard Riemann and Joseph Liouville in 1832 with what is now called the Riemann-Liouville integral. There are many applications for fractional integration. Fractional order control, a field of control theory, relies on fractional integration of measured parameters to produce control values for control actuators. In signal pulse detection, digital fractional integrators have application in the efficient detection of received signal pulses with unknown pulse heights and pulse rise times in the presence of noise.

The Grunwald-Letnikov differintegral, given by the following equation (EQ. 3), is a mathematical definition of the fractional integral of a continuous function $f(x)$ for fractional integration parameter $\alpha$.

$$D^{-\alpha} f(x) = \lim_{n \to \infty} \left( \frac{n}{x - \alpha} \right)^{\alpha} \sum_{i=0}^{n} \frac{\Gamma(\alpha + i)}{i! \Gamma(\alpha)} f\left( x - i \left( \frac{x - \alpha}{n} \right) \right)$$

It would be desirable to be able to implement the Grunwald-Letnikov differintegral approach of EQ. 3 as well as similar approaches in a hardware, firmware, and/or software implementation for use in, for example, digital signal processing of received signals.

OVERVIEW

An embodiment of the present invention is directed to an implementation of a digital fractional order of integration integrator in hardware, firmware and/or software. The digital fractional integrator provides a method for computation of the discrete summation of the Grunwald-Letnikov differintegral formula over the over the interval from 0 to n. Implementations of the invention provide, for example, a digital filter similar to a conventional, single-pole digital IIR filter with the exception that the filter coefficient for the feedback tap is time-varying according to a set of coefficients previously computed for the fractional order $\alpha$ for the digital fractional integrator. Implementations of the invention are useful in digital signal processing applications, for example, in pulse detection of arriving pulses with an unknown rise time in the presence of noise.

In accordance with one embodiment, a method is provided for fractional digital integration of an input signal, the input signal including a time series of numerical values and the method including applying the input signal time series to one input of a two-input summer at a time i, providing an output of the summer to a delay register at time i, providing an output of the delay register from time i−1 to a two-input multiplier, providing an output of the multiplier to the summer at time i, using a resettable counter to determine a value i and index a lookup table with i to provide the indexed value of the lookup table as an input to the multiplier, and obtaining an output signal time series from the output of the summer.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

In the drawings.

DESCRIPTION OF EXAMPLE EMBODIMENTS

Example embodiments are described herein in the context of a system which implements a digital fractional integrator. Such methods and circuitry are useable, for example, in a communications receiver. Those of ordinary skill in the art will realize that the following description is illustrative only and is not intended to be in any way limiting. Other embodiments will readily suggest themselves to such skilled persons having the benefit of this disclosure. Reference will now be made in detail to implementations of the example embodiments as illustrated in the accompanying drawings. The same reference indicators will be used to the extent possible throughout the drawings and the following description to refer to the same or like items.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with this disclosure, the components, process steps, and/or data structures described herein may be implemented using various types of operating systems, computing platforms, computer programs, and/or general purpose machines. In addition, those of ordinary skill in the art will recognize that devices of a less general purpose nature, such as hardwired devices, Field Programmable Gate Arrays (FPGAs), Application Specific Integrated Circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Eraseable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card, paper tape and the like) and other types of program memory. Such memory devices and tangible media may also be used for storing the contents of the lookup table described herein.

Figure 2:
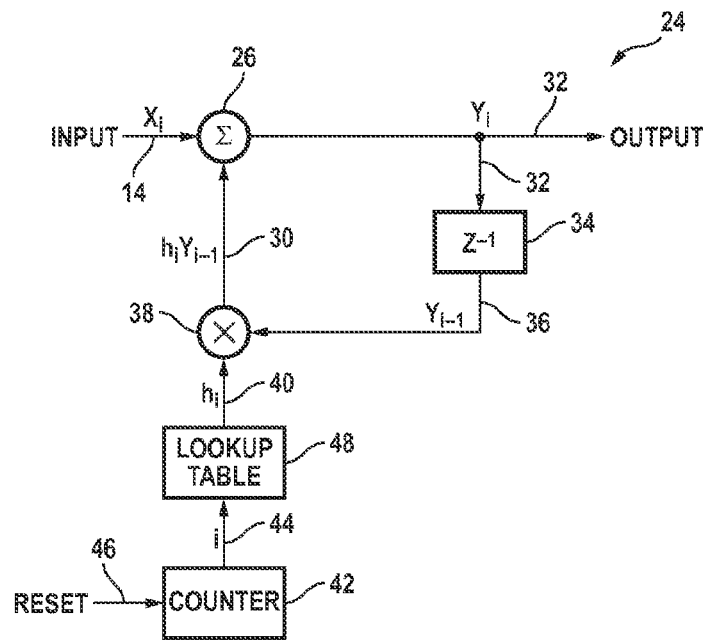
FIG. 2 is a schematic block diagram of a digital fractional order of integration integrator in accordance with one embodiment of the present invention.

FIG. 2 is a schematic block diagram of a digital fractional order of integration integrator 24 in accordance with one embodiment of the present invention. In FIG. 2, summer 26 sums the input signal $x_i$ on line 28 with feedback signal $h_i y_{i-1}$ on line 30 to produce the output signal $y_i$ on line 32. A delay register $z^{-1}$ 34 (or an equivalent functional block providing one period of signal delay) delays signal $y_i$ on line 32 by one sample delay producing the signal $y_{i-1}$ on line 36. A multiplier 38 multiplies the signal $y_{i-1}$ on line 36 by the filter coefficient $h_i$ on line 40 at time i. A counter 42 generates the signal i on line 44 which increments from value 0 to value n on each sample time. Counter 42 is resettable by a RESET signal on line 46. Initially the signal value i on line 44 from counter 42 is normally reset to 0 when the integration cycle first begins. For each value of signal i on line 44, preprogrammed lookup table 48 provides the current filter coefficient signal $h_i$ indexed by i and output on line 40 for input to multiplier 38.

The following equation (EQ. 4) gives a mathematical description for the computation performed by the digital fractional integrator circuit of FIG. 2:

$$y_i = \sum_{i=0}^{n} (x_i + h_i y_{i-1})$$

where the filter coefficients $h_i$ on line 40 are given by the following equation (EQ. 5) for integral fraction parameter α:

$$h_i = \begin{cases} 0 & \text{for } i = 0 \\ \dfrac{\alpha + i - 1}{i} & \text{for } i > 0 \end{cases}$$

Alternatively, the following equation (EQ. 6) is the z-transform description of the digital fractional integrator circuit illustrated in FIG. 2:

$$y(z) = \frac{1}{1 - h(z)z^{-1}} x(z)$$

The values of the filter coefficient $h_i$ on line 40 at time i depend on integral fraction parameter α as given in EQ. 5 for $h_i$. For an efficient hardware implementation, the values of $h_i$ for a particular value of integral fraction parameter α may be pre-computed and stored in a lookup table 48 (FIG. 2) for real-time use.

Figure 1:
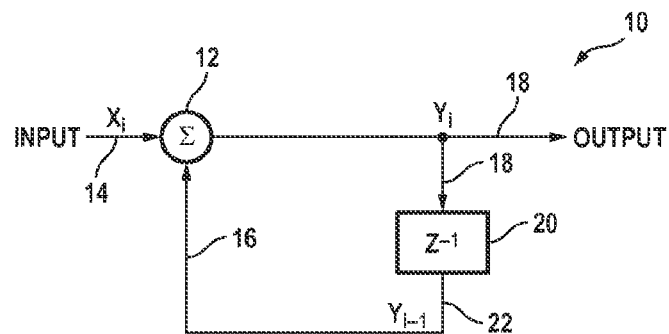
FIG. 1 is a schematic block diagram of a digital unity order of integration integrator in accordance with the prior art.

Table 1 provides a table of the first twenty values of filter coefficient $h_i$ for fractional integrator parameter α=1. For this particular value of fractional integrator parameter α the values of the filter coefficient $h_i$ are all equal to unity. For this particular case, the digital fractional integrator of FIG. 2 computes the same output values as the prior art digital integrator of FIG. 1:

TABLE 1

| i | i − α + 1 | $h_i = \dfrac{i - \alpha + 1}{i}$ |
|---|---|---|
| 0 | 0 | 0.0000 |
| 1 | 1 | 1.0000 |
| 2 | 2 | 1.0000 |
| 3 | 3 | 1.0000 |
| 4 | 4 | 1.0000 |
| 5 | 5 | 1.0000 |
| 6 | 6 | 1.0000 |
| 7 | 7 | 1.0000 |
| 8 | 8 | 1.0000 |
| 9 | 9 | 1.0000 |
| 10 | 10 | 1.0000 |
| 11 | 11 | 1.0000 |
| 12 | 12 | 1.0000 |
| 13 | 13 | 1.0000 |
| 14 | 14 | 1.0000 |
| 15 | 15 | 1.0000 |
| 16 | 16 | 1.0000 |
| 17 | 17 | 1.0000 |
| 18 | 18 | 1.0000 |
| 19 | 19 | 1.0000 |
| 20 | 20 | 1.0000 |

Table 2 provides a table of the first twenty values of filter coefficient $h_i$ for fractional integrator parameter α=0.5. For this particular value of fractional integrator parameter α the values of the filter coefficient $h_i$ start at 0 and then vary from 1.5000 to 1.0250:

TABLE 2

| i | i − α + 1 | $h_i = \dfrac{i - \alpha + 1}{i}$ |
|---|---|---|
| 0 | 0.5 | 0.0000 |
| 1 | 1.5 | 1.5000 |
| 2 | 2.5 | 1.2500 |
| 3 | 3.5 | 1.1667 |
| 4 | 4.5 | 1.1250 |
| 5 | 5.5 | 1.1000 |

TABLE 2-continued

| i | i − α + 1 | $h_i = \frac{i - \alpha + 1}{i}$ |
|---|---|---|
| 6 | 6.5 | 1.0833 |
| 7 | 7.5 | 1.0714 |
| 8 | 8.5 | 1.0625 |
| 9 | 9.5 | 1.0556 |
| 10 | 10.5 | 1.0500 |
| 11 | 11.5 | 1.0455 |
| 12 | 12.5 | 1.0417 |
| 13 | 13.5 | 1.0385 |
| 14 | 14.5 | 1.0357 |
| 15 | 15.5 | 1.0333 |
| 16 | 16.5 | 1.0313 |
| 17 | 17.5 | 1.0294 |
| 18 | 18.5 | 1.0278 |
| 19 | 19.5 | 1.0263 |
| 20 | 20.5 | 1.0250 |

Table 3 provides a table of the first twenty values of filter coefficient $h_i$ for fractional integrator parameter α=0. For this particular value of fractional integrator parameter α, the values of the filter coefficient $h_i$ start at 0 and then vary from 2.0000 to 1.0500:

TABLE 3

| i | i − α + 1 | $h_i = \frac{i - \alpha + 1}{i}$ |
|---|---|---|
| 0 | 1 | 0.0000 |
| 1 | 2 | 2.0000 |
| 2 | 3 | 1.5000 |
| 3 | 4 | 1.3333 |
| 4 | 5 | 1.2500 |
| 5 | 6 | 1.2000 |
| 6 | 7 | 1.1667 |
| 7 | 8 | 1.1429 |
| 8 | 9 | 1.1250 |
| 9 | 10 | 1.1111 |
| 10 | 11 | 1.1000 |
| 11 | 12 | 1.0909 |
| 12 | 13 | 1.0833 |
| 13 | 14 | 1.0769 |
| 14 | 15 | 1.0714 |
| 15 | 16 | 1.0667 |
| 16 | 17 | 1.0625 |
| 17 | 18 | 1.0588 |
| 18 | 19 | 1.0556 |
| 19 | 20 | 1.0526 |
| 20 | 21 | 1.0500 |

Figure 3:
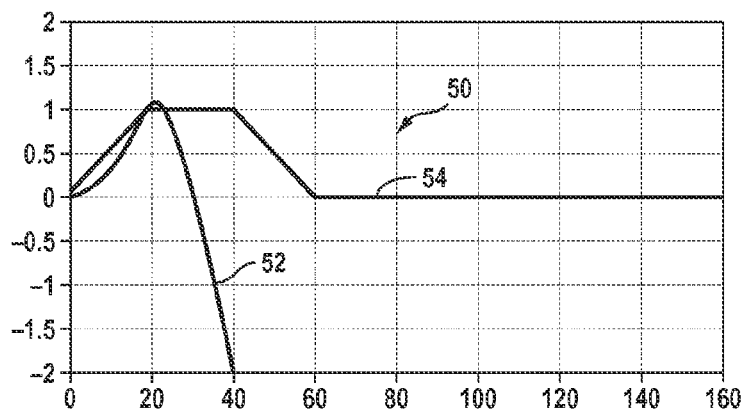
FIG. 3 is a graph of a pulse discriminator response curve (amplitude vs. time) in response to a one-shot trapezoidal input waveform in accordance with one embodiment of the present invention.

FIG. 3 is a graph 50 of a pulse discriminator response curve 52 (amplitude vs. time) in response to a one-shot trapezoidal input waveform 54 in accordance with one embodiment of the present invention. In accordance with this example the goal is to detect the rising edge of waveform 54 which rises from amplitude 0 at time 0 to amplitude 1 at time 20 before flattening out. Curve 52 rises until just a short time after curve 54 flattens out to about amplitude 1.1 at about time 22. It then drops quickly to amplitude −2 at time 40 thus providing a good indication of the end of the rise of the leading edge of the trapezoidal pulse of waveform 54.

While embodiments and applications have been shown and described, it would be apparent to those skilled in the art having the benefit of this disclosure that many more modifications than mentioned above are possible without departing from the inventive concepts disclosed herein. The invention, therefore, is not to be restricted except in the spirit of the appended claims.

What is claimed is:

1. A method for fractional digital integration of an input signal, the input signal comprising a time series of numerical values, the method comprising:
   applying the input signal time series to one input of a two-input summer at a time i;
   providing an output of the summer to a delay register at time i;
   providing an output of the delay register from time i−1 to a two-input multiplier;
   providing an output of the multiplier to the summer at time i;
   using a resettable counter to determine a value i and index a lookup table with i to provide the indexed value of the lookup table as an input to the multiplier; and
   obtaining an output signal time series from the output of the summer.

2. The method of claim 1, wherein the lookup table stores a plurality of values $h_i$ indexed by i.

3. The method of claim 2, wherein the values of $h_i$ are pre-computed filter coefficients.

4. The method of claim 3, wherein the pre-computed filter coefficients $h_i$ for integral order α are determined by the equation:

$$h_i = \begin{Bmatrix} 0 & \text{for } i = 0 \\ \frac{\alpha + i - 1}{i} & \text{for } i > 0 \end{Bmatrix}.$$

5. An apparatus for fractional digital integration of an input signal, the input signal comprising a time series of numerical values, the apparatus comprising:
   means for applying the input signal time series to one input of a two-input summer at a time i;
   means for providing an output of the summer to a delay register at time i;
   means for providing an output of the delay register from time i−1 to a two-input multiplier;
   means for providing an output of the multiplier to the summer at time i;
   means for using a resettable counter to determine a value i and index a lookup table with i to provide the indexed value of the lookup table as an input to the multiplier; and
   means for obtaining an output signal time series from the output of the summer.

6. The apparatus of claim 5, wherein the lookup table is configured to store a plurality of values $h_i$ indexed by i.

7. The apparatus of claim 6, wherein the values of $h_i$ are pre-computed filter coefficients.

8. The apparatus of claim 7, wherein the pre-computed filter coefficients $h_i$ for integral order α are determined by the equation:

$$h_i = \begin{Bmatrix} 0 & \text{for } i = 0 \\ \frac{\alpha + i - 1}{i} & \text{for } i > 0 \end{Bmatrix}.$$

9. A fractional digital integrator configured for fractional digital integration of an input signal comprising a time series of numerical values, the integrator comprising:
   a two-input summer configured to receive the input signal time series at one of its inputs at a time i;
   a delay register configured to receive an output of the summer at time i;

a two-input multiplier configured to receive an output of the delay register from time i−1 at time i at one of its inputs;

the second of the inputs of the summer configured to receive an output of the multiplier at time i;

a resettable counter configured to determine a value i and index a lookup table with i to provide an indexed value of the lookup table as a second input to the multiplier; and the output of the summer configured to provide an output signal time series.

10. The integrator of claim 9, wherein the lookup table is configured to store a plurality of values $h_i$ indexed by i.

11. The integrator of claim 10, wherein the values of $h_i$ are pre-computed filter coefficients.

12. The method of claim 11, wherein the pre-computed filter coefficients $h_i$ for integral order $\alpha$ are determined by the equation:

$$h_i = \begin{cases} 0 & \text{for } i = 0 \\ \frac{\alpha + i - 1}{i} & \text{for } i > 0 \end{cases}.$$

* * * * *